United States Patent [19]
Eberhard

[11] Patent Number: 4,706,068
[45] Date of Patent: Nov. 10, 1987

[54] FOUR WIRE KEYBOARD INTERFACE

[75] Inventor: Martin F. Eberhard, Palo Alto, Calif.

[73] Assignee: Wyse Technology, Inc., San Jose, Calif.

[21] Appl. No.: 696,261

[22] Filed: Jan. 30, 1985

[51] Int. Cl.$^4$ ................................................ G06F 3/02
[52] U.S. Cl. ............................ 340/365 S; 340/365 R; 400/485
[58] Field of Search ............ 340/365 S, 365 R, 365 C, 340/711, 712, 825.79; 178/17 C, 18; 179/90 K; 400/485, 477; 361/57, 87

[56] References Cited

U.S. PATENT DOCUMENTS

| | | | |
|---|---|---|---|
| 3,918,051 | 11/1975 | Bernin et al. | 340/365 E |
| 3,921,166 | 11/1975 | Volpe | 340/365 S |
| 4,015,254 | 3/1977 | Strandt . | |
| 4,293,849 | 10/1981 | Lacy . | |
| 4,346,369 | 8/1982 | Macy . | |
| 4,405,917 | 9/1983 | Chai | 340/365 S |
| 4,408,184 | 10/1983 | Ishii . | |
| 4,408,191 | 10/1983 | Fowler, III . | |
| 4,414,538 | 11/1983 | Schnizlein | 340/365 C |
| 4,434,472 | 2/1984 | Kachum . | |
| 4,459,581 | 7/1984 | Wilson et al. . | |
| 4,470,038 | 9/1984 | Amano et al. . | |
| 4,482,955 | 11/1984 | Amano et al. | 340/365 S |
| 4,502,038 | 2/1985 | Lowenthal et al. | 340/365 |

*Primary Examiner*—John W. Caldwell, Sr.
*Assistant Examiner*—Mahmoud Fatahi-Yar
*Attorney, Agent, or Firm*—James E. Eakin

[57] ABSTRACT

A computer system comprises a terminal and a keyboard, the terminal comprises a central control unit for controlling the operation of the keyboard and the keyboard comprises a switch array, the switch array has a plurality of rows and a plurality of columns. The terminal further comprises a data output port for transmitting a command signal from the terminal central control unit and a data input port for receiving a data signal from the keyboard. The command signal comprises a keyboard initialize signal and a keyboard increment signal. The keyboard further comprises a four-wire keyboard interface for communicating with the terminal. The four-wire keyboard interface facilitates the initialization of a sequence for scanning the switch array after the receipt of the keyboard clear signal, the scanning of the switch array for detecting the activation of a location of the switch array after the receipt of the keyboard increment signal, and the transmission of the data signal after detecting the activation of the location of the switch array.

12 Claims, 9 Drawing Figures

FOUR WIRE KEYBOARD INTERFACE

TECHNICAL FIELD

This invention relates to communication between subsystems in a computer system, and more particularly, to communication between a keyboard and a terminal.

BACKGROUND ART

Computer systems in the prior art have employed a variety of devices and techniques to permit the communication between subsystems of a system. In general, a computer system includes subsystems such as central processing units, video display devices, keyboards, and other units generally referred to as terminals. Communication between such a keyboard and a terminal in the prior art involved two techniques.

The first technique, as best illustrated in FIG. 1, is the use of UARTs to transmit and receive data between the keyboard and the terminal. UART is an acronym for "universal asynchronous receiver and transmitter." It is a device that is capable of transmitting and receiving serial data and transforming the data into parallel data, or vice versa. Of the four wires which are provided to interface the keyboard with the terminal, wires one and two permit communication between the keyboard and the terminal. The two remaining connections are used to connect the keyboard and the terminal to a power source and a ground, respectively. In operation, a keyboard microprocessor first scans the keyboard switch array to determine which key of the array has been depressed. Generally, the code that has been assigned to identify the particular key is then transmitted to the keyboard microprocessor via the keyboard UART. The terminal UART receives this code and transmits it to the terminal microprocessor. This code is transmitted across one of the data links such as wire one or wire two. The terminal microprocessor then stores this information or retransmits it to other devices that are connected to the terminal. Macy, U.S. Pat. No. 4,346,369, discloses some aspects of this first technique.

The alternative technique for communication in the prior art, as shown in FIG. 2, is the use of a plurality of data wires. In such a case, for example, a ten-wire interface is provided in the keyboard and a similar tenwire interface is provided in the terminal 14. In this instance, seven wires are used by the terminal, in essence, its microprocessor to address the keyboard switch array. An eighth wire is used to transmit data from the keyboard to the terminal. The remaining two wires are the power and ground wires. UARTs are eliminated in this alternative technique. Fowler, III, U.S. Pat. No. 4,408,191 and Amano et al., U.S. Pat. No. 4,470,038 describe some aspects of this second technique.

Each of these prior art techniques, however, is deficient in some aspects. For the first prior art technique, not only are UARTs relatively expensive devices but also a microprocessor is required in the keyboard. As for the second prior art technique, a ten-wire cable is both relatively expensive and cumbersome.

DISCLOSURE OF THE INVENTION

In view of the prior art, it is a major object of the present invention to provide a keyboard interface for communication between a keyboard and a terminal that is both relatively inexpensive and simple.

It is another object of the present invention to provide a keyboard interface that utilizes a minimal number of data lines without requiring the use of a parallel to serial data conversion device.

In order to accomplish the above and still further objects, the present invention provides a four-wire keyboard interface means for permitting communication between a keyboard and a terminal. The keyboard and the terminal are subsystems of a computer system. The terminal comprises a central control means for controlling the operation of the keyboard, a data output port for transmitting a command signal from the terminal central control means, and a data input port for receiving a data signal from the keyboard. The command signal comprises a keyboard initialize signal and a keyboard increment signal. In addition to the interface means of the present invention, the keyboard comprises a switch array, the switch array has a plurality of rows and a plurality of columns. The four-wire keyboard interface means facilitates the initialization of a sequence of the scanning of the switch array after the receipt of the keyboard clear signal, the scanning of the switch array for detecting the activation of a location of the switch array after the receipt of the keyboard increment signal, and the transmission of the data signal after detecting the activation of the location of the switch array.

Other objects, features, and advantages of the present invention will appear from the following detailed description of the best mode of a preferred embodiment, taken together with the accompanying drawings.

BEST MODE FOR CARRYING OUT THE INVENTION

Figure 1:
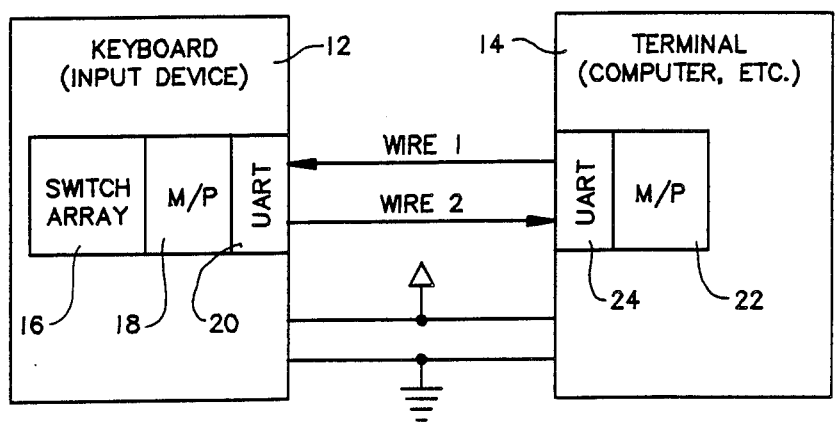
FIG. 1 is an embodiment of a prior art technique for communication between a keyboard and a terminal.

Referring to FIG. 1, there is shown a prior art communication system for exchange information and data between a keyboard 12 and a terminal 14. Keyboard 12 may be one of any number of devices which are capable of inputting alphanumerics. Similarly, terminal 14 may be one of any number of devices such as a central processing unit, a video display device, etc. Basically, keyboard 12 includes a keyboard switch array 16, a microprocessor 18 and a UART 20. The UART, an acronym for "universal asynchronous receiver and transmitter," is a device that is capable of transmitting and receiving serial data and transforming the data into parallel data, or vice versa. Terminal 14, in the illustration, is a central processing unit that includes a microprocessor 22 and a UART 24.

Four wires are provided to interface keyboard 12 with terminal 14, thereby contributing to the name "four-wire interface." For example, wires one and two are provided to permit communication between keyboard 12 and terminal 14. In addition, wire three connects both keyboard 12 and terminal 14 to a power source and wire four connects both devices to the ground. In operation, keyboard microprocessor 18 scans keyboard switch array 16 to determine which key of the array has been depressed. Generally, the code that has been assigned to identify the particular key is then transmitted by keyboard UART 20 to its counterpart, terminal UART 24. This code is transmitted across one of the data links such as wire one or wire two. Terminal microprocessor 22 then stores this information or retransmits it to other devices that are connected to terminal 14.

Figure 2:
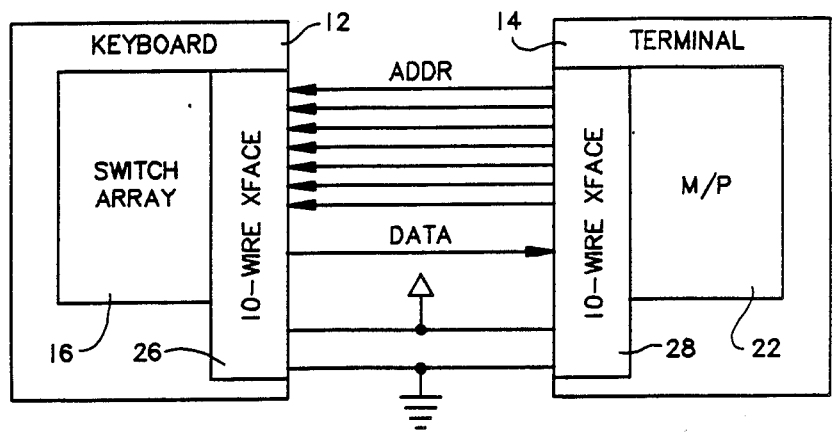
FIG. 2 is an embodiment of another prior art technique for communication between a keyboard and a terminal.

An alternative technique for communication in the prior art, as shown in FIG. 2, is the use of a plurality of data wires. In such a case, for example, a ten-wire interface 26 and a ten-wire interface 28 are provided in keyboard 12 and terminal 14, respectively. In this instance, seven wires are used by terminal 14 or its microprocessor 22 to address switch array 16 and an eighth wire is used to transmit data from keyboard 12 to terminal 14. The remaining two wires are the power and ground wires. UARTs are eliminated in this alternative technique.

Each of these prior art techniques includes disadvantages. For the first prior art technique, not only are UARTs relatively expensive devices but also a microprocessor is required in the keyboard. As for the second prior art technique, a ten-wire cable is both relatively expensive and cumbersome.

Figure 3:
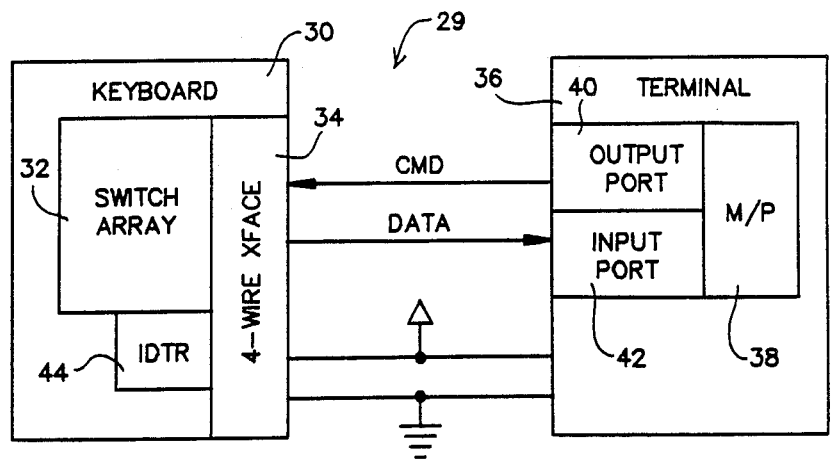
FIG. 3 is a simplified block diagram of the four-wire keyboard interface means of the present invention and its relationship with other subsystems of a computer system.

The present invention, as best shown in FIG. 3, provides a keyboard 30 of a computer system 29 that has a switch array 32 and a four-wire interface means 34. An indicator 44 such a bell or a light is connected to interface means 34. In addition, a terminal 36 of computer system 29 is provided that has a microprocessor 38, an output port 40, and an input port 42. Although four wires are provided to link keyboard 30 with terminal 36, UARTs and the keyboard microprocessor are eliminated. Two of the wires are used for communication between keyboard 30 and terminal 36. One of the remaining wires connects the two devices to a power source and the last wire connects the two devices to a ground.

In general, the operation of the present invention is initiated by terminal microprocessor 38 which sends a command signal CMD. The command signal comprises a keyboard initialize signal and a keyboard increment signal. The sequence of operations begins with the presence of the keyboard initialize signal. This signal causes the initialization of keyboard interface means 34, preparing it for the scanning of the switch array. After keyboard interface means 34 has been initialized, keyboard increment signals are sequentially forwarded by terminal microprocessor 38. After each keyboard increment signal, terminal microprocessor 38 senses the state of a particular location or key of the switch array that has been addressed by keyboard interface means 34. This is to detect whether or not that particular key has been activated or depressed by an operator. Interface means 34 then transmits the status of that key to terminal microprocessor 38 via a data signal line DATA. This response from keyboard interface means 34 is merely a simple acknowledgement, i.e., whether the inquired key of switch array 32 has been depressed. This response, the DATA signal, is not a coded message.

Figure 4:
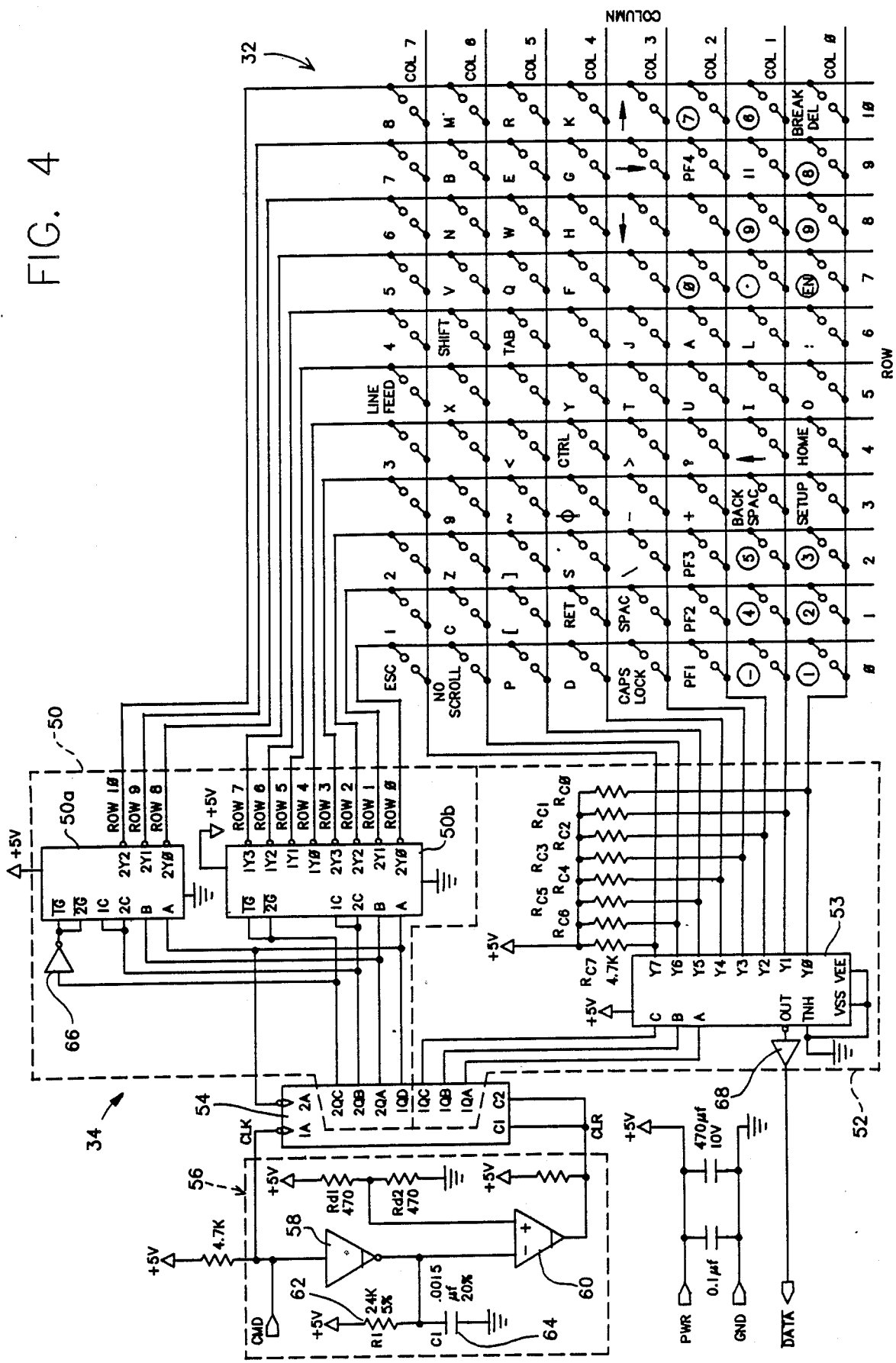
FIG. 4 is a schematic view of the four-wire keyboard interface means of FIG. 3, along with its relationship with a keyboard switch array.

More particularly, four-wire interface means 34 and switch array 32 are more fully described in FIG. 4. Switch array 32 is an 11×8 array, i.e., a conventional array with eleven rows and eight columns. Switch array 32 is not limited to an 11×8 array, and that particular dimension is merely exemplary.

Interface means 34 comprises a row selector means 50 the outputs of which are connected to the rows of switch array 32, a column selector means 52 the inputs of which are connected to the columns of switch array 32. Row selector means 50 in the preferred embodiment comprises two demultiplexers 50A and 50B each of which is a Type SN54LS156 demultiplexer manufactured by Texas Instruments Inc. of Dallas, Tex. As shown in FIG. 4, only three outputs of demul-tiplexer 50A are used, outputs 2Y2, 2Y1, and 2Y0. The remaining outputs are left in the nonconnected (n/c) state. Row selector means 50 also comprises an inverter 66. Column selector means 52 in the preferred embodiment comprises a MM74HC4051 multiplexer 53 manufactured by National Semiconductor Corp. of Santa Clara, Calif. Each of the columns, through a resistor, is tied to a 5-volt power source. These switch array resistors are designated $R_{c0}$ through $R_{c7}$. Column selector means 52 also comprises a driver means 68.

In addition, row selector means 50 and column selector means 52 each share a counter 54. Counter 54 in the preferred embodiment is a Type SN54LS393 counter manufactured by Texas Instruments. Counter 54 has a plurality of outputs each of which corresponds to a bit of a binary numeral. This binary numeral represents a count that is provided by counter 54. The four outputs of counter 54 corresponding to the four most significant bits of the binary numeral are provided to control the operation of row selector means 50 and the three outputs of counter 54 corresponding to the three least significant bits of the binary numeral are provided to control the operation of column selector means 52.

Further, interface means 34 comprises a command differentiator means 56. Command differentiator means 56 is provided for routing commands which are forwarded to keyboard 30 by terminal microprocessor 38. Differentiator means 56 includes an open-collector inverter 58 which in turn is connected to a voltage comparator 60, a resistor 62 and a capacitor 64. The command signal CMD from terminal microprocessor 38 is provided to the clock input of counter 54 and to inverter 58. If the CMD signal does not activate differentiator means 56, then that signal, which appears at the input of counter 54, is defined as the keyboard increment or clock signal CLK. If, however, differentiator means 56 is activated, causing comparator 60 to produce a high output, then that command signal is defined as the keyboard initialize or clear signal CLR. Comparator 60 in the preferred embodiment is a LM339 voltage comparator manufactured by National Semiconductor. Open-collector inverter 58 has a non-active output characteristic when its output is high. Thus, in this condition, it is essentially disconnected electrically from resistor 62 and capacitor 64. In such a state, the output of inverter 58 has no effect on the current that charges capacitor 64. Thus, capacitor 64 charges solely through resistor 62, at a selected time constant of RC, the product of the values of resistor 62 and capacitor 64.

In addition, the output of comparator 60, the CLR signal, is connected to the clear input of counter 54. The outputs of counter 54 are connected to row selector means 50 and column selector means 52 with the four highest binary bits connected to row selector means 50 and the three lowest connected to column selector means 52. Demultiplexers 50A and 50B of row selector means 50 include 10 outputs the operation of the top three, i.e., those of demultiplexer 50A, is controlled by inverter 66. The three lowest outputs of counter 54 are connected to multiplexer 53 for enabling its eight inputs. The output of multiplexer 53, which is designated as the data signal DATA, is connected to driver 68. The output of driver 68 is connected to the DATA wire or wire two of FIG. 3. The power and the ground are provided in a conventional manner as shown in FIG. 4.

Figure 5:
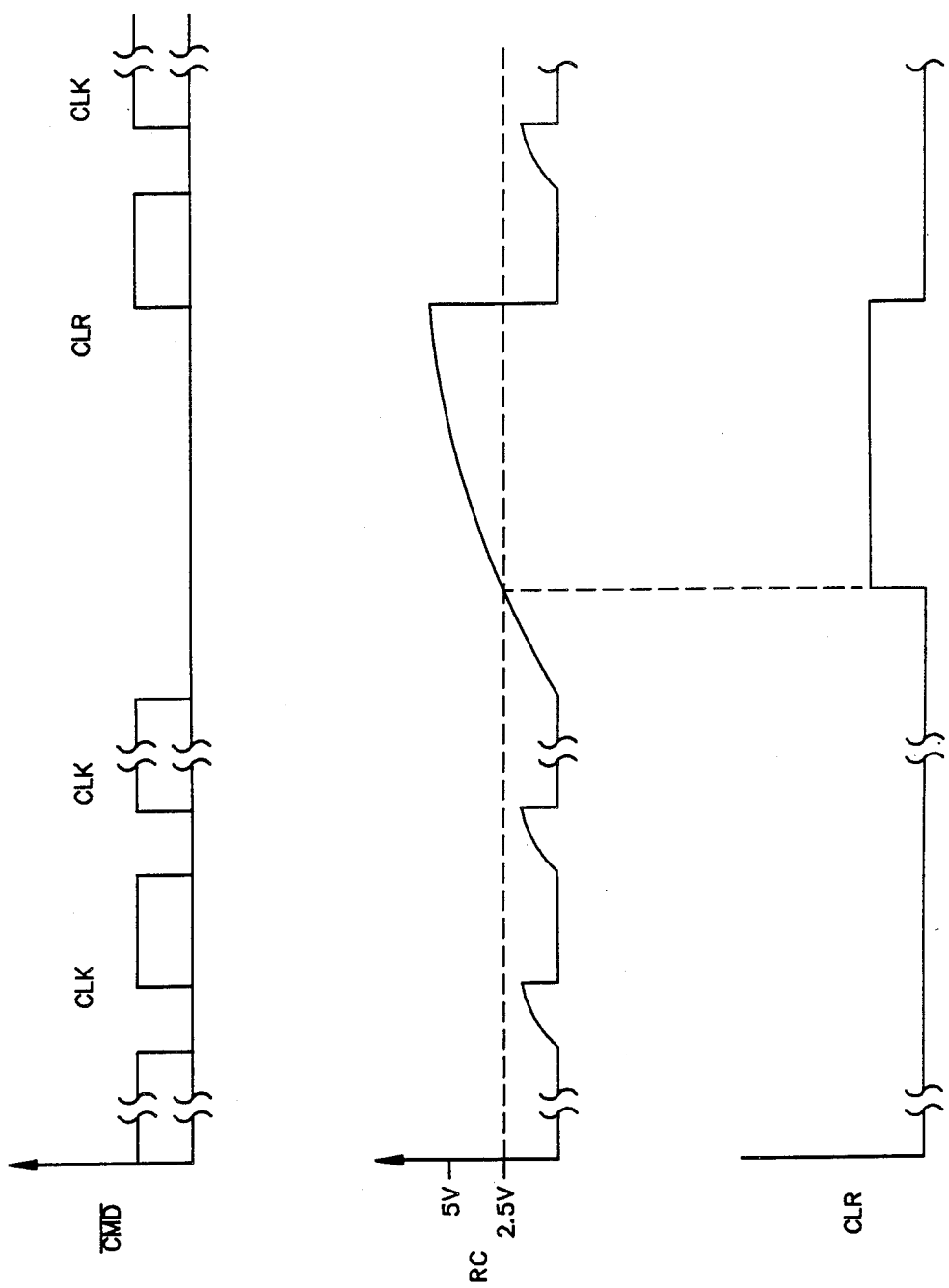
FIG. 5 is a simplified timing diagram of the four-wire keyboard interface means of FIG. 4.

In operation, terminal microprocessor 38 begins the sequence by sending a $\overline{CMD}$ signal via outport 40. Transmitting across CMD wire or wire one, as best shown in FIG. 3, this signal is received by both counter 54 and command differentiator means 56, as best shown in FIG. 4. To minimize the number of interconnections between keyboard 30 and terminal 36, the CMD line is capable of trasmitting two signals the difference between them is their duration. As best shown in FIG. 5, if the $\overline{CMD}$ signal is a pulse of short duration, it is designated as a clock $\overline{CLK}$ signal, which is used to increment counter 54 for incremental scanning of switch array 32. The $\overline{CLK}$ signal is generally a pulse with a duration from 0.5 to 5.0 microseconds. If the $\overline{CMD}$ signal is a pulse of longer duration, then command differentiator means 56 is activated, producing a second signal, the clear CLR signal. The CLR signal initializes row selector means 50 and column selector means 52. To produce the CLR signal, which is used to initialize the scan sequence, the $\overline{CMD}$ signal must be a pulse of at least twice the duration of the $\overline{CLK}$ pulse, e.g., 20 microseconds. The values for the $\overline{CLK}$ and CLR signals are not limiting, but rather, exemplary.

When the CMD signal is low, whether it be of long or short duration, inverter 58 permits the charging of capacitor 64. If the $\overline{CMD}$ signal is a long-duration signal, capacitor 64 will charge up to and pass beyond a threshold level of 2.5 volts. When capacitor 64 reaches the 2.5-volt level, comparator 60 immediately goes high, which has been designated as the clear CLR signal. The CLR pulse resets counter 54 to begin the switch array scanning procedure. The other input of comparator 60 is tied to a constant reference voltage of 2.5 volts, the product of a conventional voltage divider 70. Voltage divider 70 comprises two resistors $R_{d1}$, $R_{d2}$ of equal value that are connected to a 5-volt power source.

The next $\overline{CMD}$ signal that appears is a short-duration pulse which functions as a clock pulse $\overline{CLK}$. In this instance, inverter 58 permits capacitor 64 to charge, but the charging time constant, as controlled by resistor 62, does not allow capacitor 64 to reach the 2.5-volt level before the signal returns to its previous state. Thus, comparator 60 cannot be enabled to send the CLR pulse. The short-duration pulse, acting as the $\overline{CLK}$ pulse, therefore, increments counter 54. Accordingly, counter 54 is permitted to control the operation of row selector means 50 and column selector means 52 in order to detect which, if any, key of switch array 32 has been depressed. Each of the remaining keys of switch array 32 is sensed in this fashion.

To sense the depression of a key of switch array 32, the entire switch array must be scanned. The sequence of scanning is from position row0-column0 through position row0-column7, and continues in this fashion one row at a time, terminating at position row10-column7. For example, after the receipt of the first CLK pulse, position row0-column0 is sensed. Before the next CLK pulse is sent to keyboard 30, terminal microprocessor 38 senses whether a DATA signal has been received by terminal input port 42. Sufficient time is provided between CLK pulses to permit the keyboard circuitry to respond and send back a data signal DATA if that position row0-column0 has been activated or the key corpesponding to that position has been depressed. Thus, the low $\overline{DATA}$ signal indicates the depression of that key by an operator when that key is addressed. Since microprocessor 38 initiated the command signal $\overline{CMD}$ for sensing this particular key, it knows which key has been depressed. This verification is simple, just the presence or absence of depression. It need not, as is the case for prior art devices, received a coded message representing the depressed key. The next CLK pulse causes interface means 34 to sense the status of position row0-column1. In this sequential fashion, the entire switch array is scanned in approximately 10 milliseconds, which is faster than the depression of the next key by the human operator. A conventional indicator 44 such as a bell or a light may be connected to interface means 34.

Figure 9:
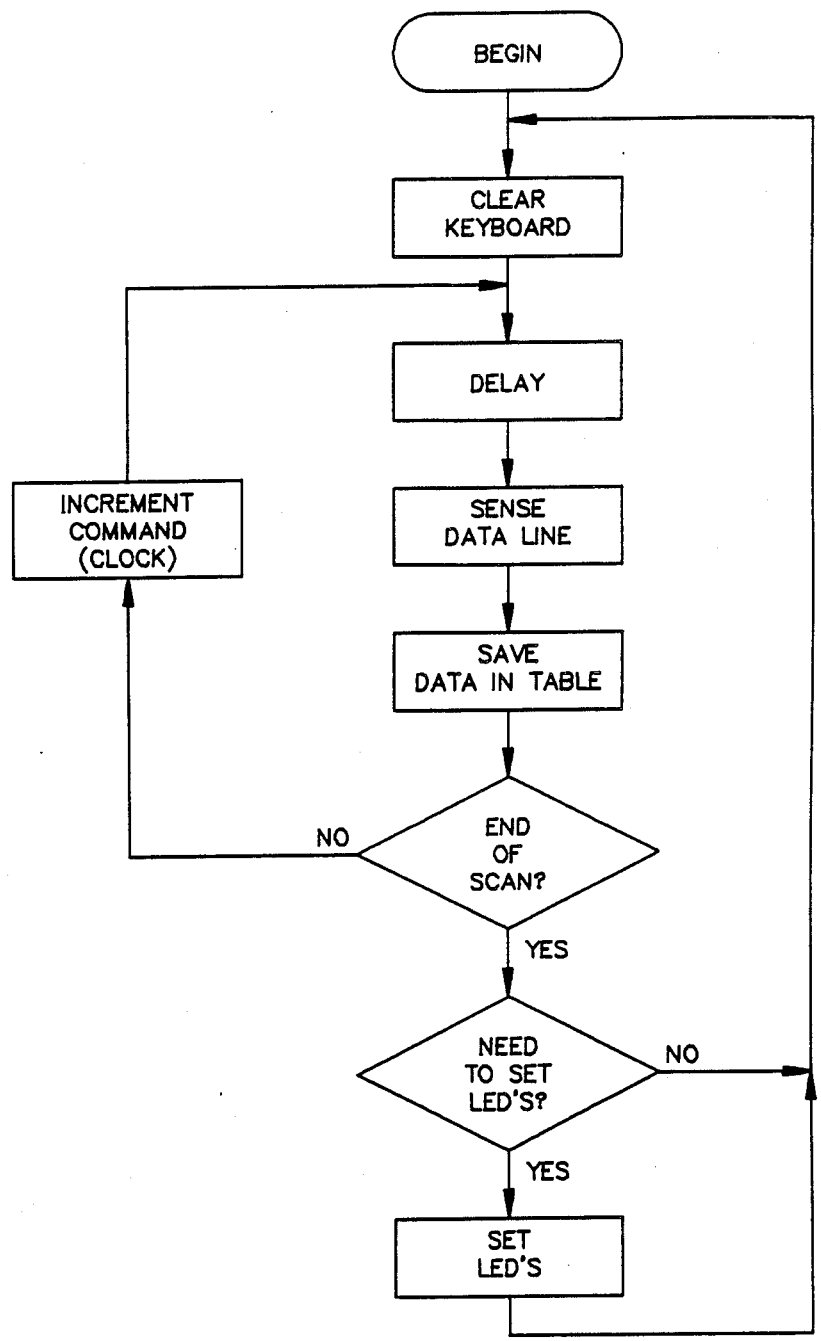
FIG. 9 is a flow diagram of the software for the four-wire keyboard interface means of the present invention.

To illustrate the operation of interface means 34, lets assume that the key representing the letter "W" of the word "WYSE" has been depressed. The sequence of operations is best illustrated by the flow diagram of FIG. 9. Terminal microprocessor 38 first clears interface means 34 and begins the sequential scanning of switch array 32, beginning at position row0-column0. The transmitted command signals $\overline{CMD}$ increment counter 54 so as to sequentially operate row selector means 50 and column selector means 52 in scanning switch array 32. In this fashion, the status of all positions up to and include position row8-column4 are sensed. Since none of these keys were depressed, each of the responses DATA is a high signal.

At the next binary numeral of the scan, "1000101", the top four outputs of counter 54 are routed to row selector means 50. Since the topmost bit of counter 54 is a numeral "1", it disables the lower demultiplexer 50B. Inputs $\overline{1G}$ and $\overline{2G}$ of demultiplexer 50B are designed to be active if they receive a low or zero bit. The topmost bit is inputted to inverter 66, which produces a low signal that enables upper demultiplexer 50A. With upper demultiplexer 50A enabled, the presence of low or zero bits at inputs 1C/2C, B and A permits upper demultiplexer 50A to output a low or zero signal at output 2Y0. Output 2Y0 is connected to row ROW8. Since array position row8-column5 is shorted, due to the depression of its corresponding key, the input of multiplexer 53 connected to column COL5, input Y5, is held low by the presence of a signal on row ROW8.

Since the binary numeral is "1000101", the bottom three bits of counter 54 are outputted to multiplexer 53. The presence of the bits "101" at pins A, B, and C of multiplexer 53 activates input Y5, permitting it to sense the current on column COL5. Multiplexer 53 then outputs a signal at output pin OUT. This signal, after it has been amplified by driver 68, is the $\overline{\text{DATA}}$ signal that is forwarded via DATA wire or wire 2 to terminal microprocessor 38. The scan continues in this fashion until each of the remaining positions of the switch array has been sensed. The status of each of these keys, of course, is that it is not depressed.

As stated previously, the entire switch array is scanned in approximately 10 milliseconds, which is faster than the depression of the next key by the human operator. In this fashion, each of the remaining letters of the word "WYSE" is sensed during a subsequent scan. For example, at binary numerals "0101100" of a subsequent scan of switch array 32, the array position row5-column4 or the key representing "Y" is sensed. In this instance, the presence of the numeral "0" at the output of the topmost bit of counter 54 causes inverter 66 to produce a high signal, thereby inactivating top demultiplexer 50A. Correspondingly, the presence of the low signal at inputs $\overline{1G}$ and $\overline{2G}$ of lower demultiplexer 50B activates that device. The presence of a high signal at inputs 1C/2C and A causes demultiplexer 50B to output a low signal at output 1Y1, which is connected to row ROW5. The presence of the bottom three numerals "100" at multiplexer 53 causes input Y4 to be activated. Thus, a $\overline{\text{DATA}}$ signal is forwarded to terminal 36, signalling the depression of the "Y" key. Similarly, the "S" key is sensed at binary "0010100" of a third scan and the "E" key at "1001101" of a fourth scan.

Figure 6:
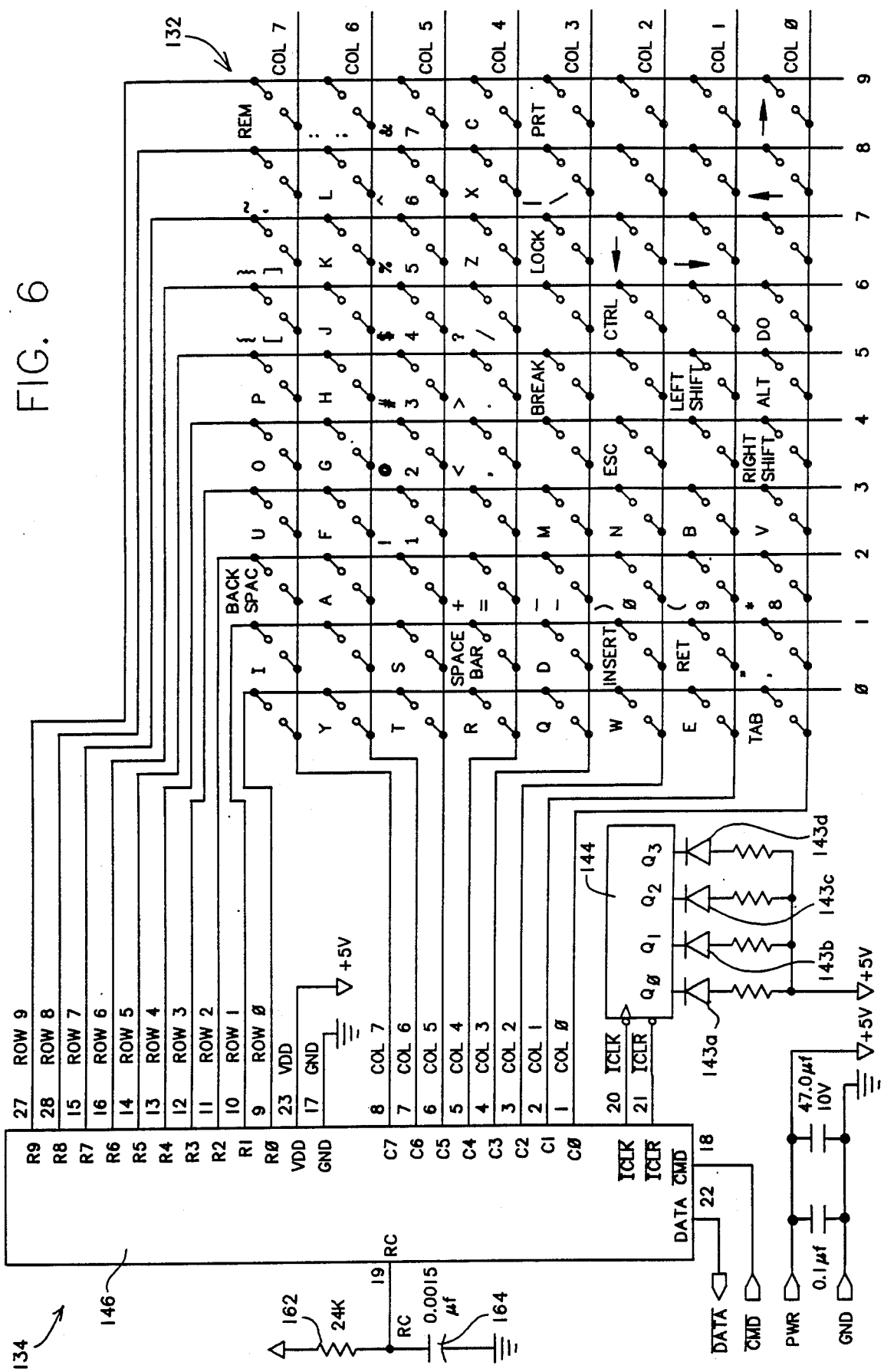
FIG. 6 is a schematic view of another embodiment of the four-wire keyboard interface means of FIG. 3, along with its relationship with a keyboard switch array and an indicator means.

As best shown in FIG. 6, row selector means 50, column selector means 52, counter 54 and a substantial portion of command differentiator means 56 are replaced by a single custom semiconductor chip 146. Those elements which are identical to their counterparts in FIG. 4 are identified by the addition of numeral "1" to the numerals identifying the counterpart element in FIG. 4. For example, the counterpart of switch array 32 is designated switch array 132 in FIG. 6.

Chip 146 includes ten output pins which are connected to the ten rows of array 132, pins 9 through 16 and pins 27 and 28. Pins 1 through 8 are connected to the eight columns of array 132. Although switch array 132 is a 10×8 matrix in this embodiment, this dimension is also exemplary. In addition, pin 19 is connected to resistor 162 and capacitor 164 of the command differentiator means 156. Moreover, pin 18 is connected to the $\overline{\text{CMD}}$ signal, pin 22 the DATA signal, pin 23 the power source and pin 17 the ground. Last, pin 20 is a $\overline{\text{ICLK}}$ signal and pin 21 is a $\overline{\text{ICLR}}$ signal both of which are connected to an indicator device 144. Indicator device 144, as illustrated in FIG. 6, is a counter that is capable of providing indications for various keyboard functions such as locking capital letters CAPS LOCK, or locking numerals NUM LOCK. The visual display for each of the four indication capabilities is one of a plurality of light emitting diodes (LED) 143a through 143d. Each of these LED's is connected to a 5-volt power source via a resistor. Although the display means in this embodiment is a visual display, audio or other forms of display are also possible. For example, beepers or other means of indication.

Figure 7:
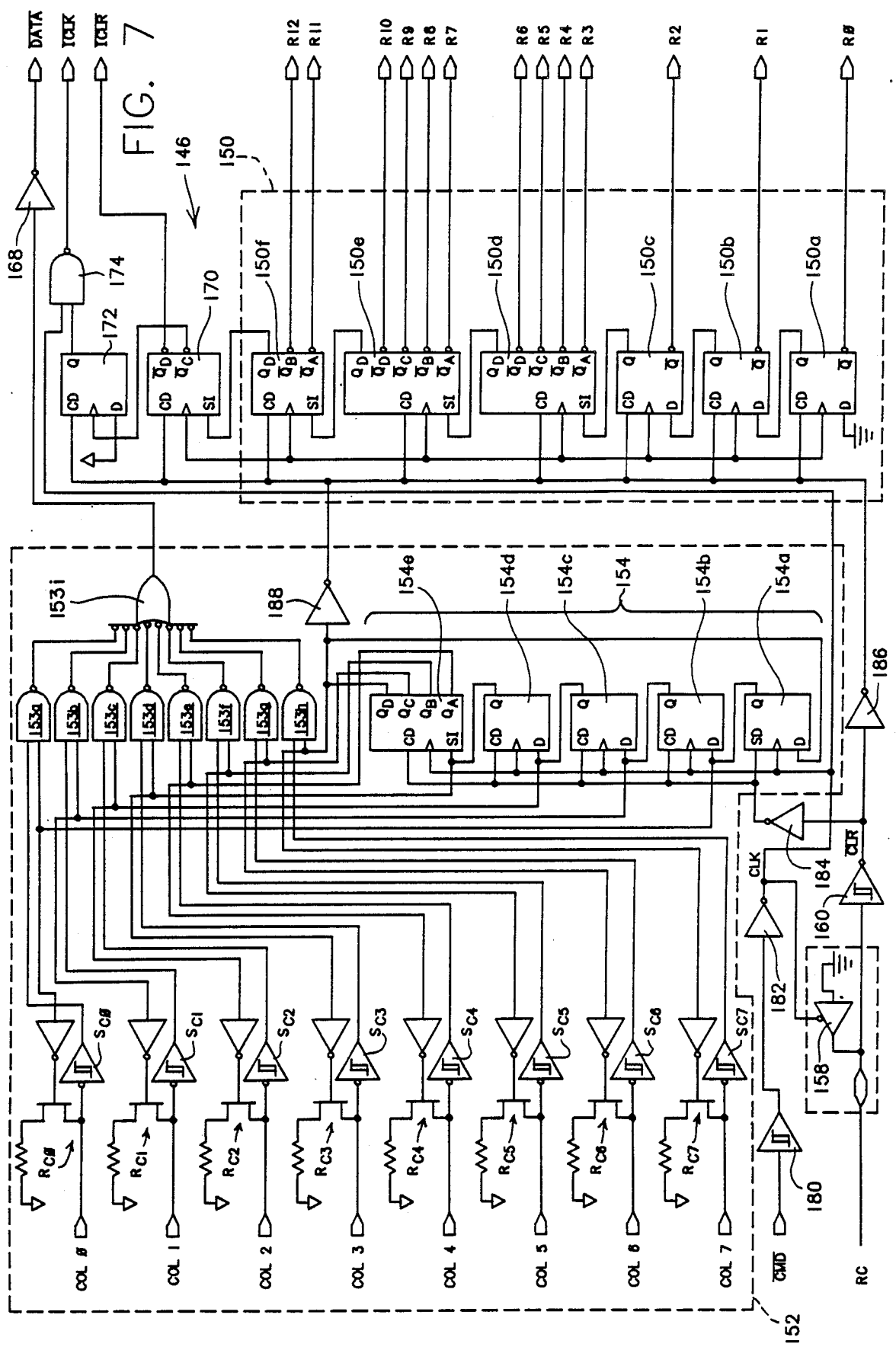
FIG. 7 is a detailed schematic view of the four-wire keyboard interface means of FIG. 6.

The internal elements of chip 146 is best illustrated in FIG. 7. Chip 146 includes a row selector means 150 and a column selector means 152. Row selector means 150 in this embodiment is a shift register the outputs of which are connected to the ten rows of array 132. Shift register 150 comprises six flip-flops, designated 150a through 150f.

Column selector means 152 in this embodiment comprises a shift register 154 that functions as a counter, a plurality of AND gates 153a-153h, a master OR gate 153i, and a plurality of active pull-up resistors $R_{c0}$ through $R_{c7}$ and associated Schmitt triggers $S_{c0}$ through $S_{c7}$. In this embodiment, shift register 154 comprises five flip-flops, designated 154a through 154e. Each of the pull-up resistors, which are positioned between the plurality of AND gates 153a–153h and column pins 1–8, representing columns COL0 through COL7, comprises a resistor, a field effect transistor (FET), and an inverter.

In addition, a Schmitt trigger 180 is provided for receiving the $\overline{\text{CMD}}$ signal. Schmitt trigger 180 is provided for noise immunity, that is, the reduction of extraneous interfering signals. Schmitt trigger 180 is in turn connected to an inverter 182 the output of which is the clock CLK signal. Moreover, the CMD signal is connected to a command differentiator means 156. Differentiator means 156 in this embodiment comprises a tri-state driver 158, a Schmitt trigger 160, a resistor 162, and a capacitor 164.

More particularly, the output of inverter 182 is connected to the control input of tri-state driver 158 the output of which is connected to the timing circuit which is comprised of resistor 162 and capacitor 164. The output of driver 158 is also connected to Schmitt trigger 160 which is configured to output a low signal if its input exceeds 2.5 volts. Schmitt trigger 160, therefore, functions as a voltage comparator. The output of Schmitt trigger 160 is a $\overline{\text{CLR}}$ signal. Tri-state driver 158 is a high impedance output device such that whenever the CLK signal is high, its output is low, causing the voltage across capacitor 164 to discharge. If the CLK signal is low, whether it be long or short in duration, tri-state driver 158 is essentially electrically disconnected from resistor 162 and capacitor 164, thereby permitting capacitor 164 to charge. Further, inverters 184, 186 and 188 are provided.

In operation, a $\overline{\text{CMD}}$ signal is received by Schmitt trigger 180 the output of which is in turn inverted by inverter 182. If the $\overline{\text{CMD}}$ signal is a long-duration pulse, then capacitor 164 will charge toward 5 volts. When the voltage of capacitor exceeds 2.5 volts, Schmitt trigger 160 is activated, producing a $\overline{\text{CLR}}$ signal to both shift registers 150 and 154. Before this signal is received by the shift registers, the $\overline{\text{CLR}}$ signal is inverted by inverters 184 and 186. If the $\overline{\text{CMD}}$ signal is a short-duration pulse, then the output of inverter 182 functions as a clock CLK signal.

With the exception of the first flip-flops of both shift registers, flip-flop 150a and flip-flop 154a, the remaining flip-flops are cleared by the CLR signal. Flip-flops 150a and 154a are set-direct (SD) flip-flops, that is, they produce a high signal at their outputs when they receive the CLR signal. The remaining flip-flops are clear-direct (CD) flip-flops, producing a low signal when they receive the CLR signal. Each of these flip-flop outputs includes an open-collector driver.

The negative output $\overline{Q}$ of flip-flop 150a now forwards a negative signal to row ROW0, permitting the sensing of all of the keys of array 132 which are connected to row ROW0. The high signal that is present at output Q of flip-flop 154a is inputted to AND gate 153a and pull-up resistor $R_{c0}$. The operation of each pull-up resistor is as follows. The inverter first inverts the received high signal and activates the FET. This then prmits a current flow from a 5-volt source through a resistor. If the key at position row0-column0 had been depressed, the low signal on row ROW0 is sensed on column COL0 which is then outputted as a high signal by the associated Schmitt trigger. Thus, only the particular key that is connected to column COL0 is sensed. In the event that all of the keys of a particular row are inadvertently depressed, only the column COL0 position for that row is activated. Instead of requiring the driver that is associated with each row pin to have the capacity to accept all of the currents which are flowing through the depressed keys, each of the row pins of chip 146 only needs to have the capacity to receive just one current. This eliminates the necessity of using output drivers which are capable of accepting high currents, thus minimizing the costs since only low-current drivers are required.

A high signal of the Schmitt trigger $S_{c0}$ coupled with the high signal of flip-flop 154a cause AND gate 153a to output a high signal. A high signal is therefore produced by master OR gate 153i, which in turn is inverted by inverter 168 before it is forwarded as the $\overline{DATA}$ signal.

In this fashion, subsequent CLK signals increment shift register 154, i.e., causing the high signal flip-flops 154a to propagate through shift register 154. Whereas flip-flops 154a–154d are conventional D-type flip-flops (DFF) which are capable of propagating one pulse at a time, flip-flop 154e is in essence a conventional shift register that is capable of activating columns COL4 through COL7 of array 132. When the topmost bit of shift register 154, i.e., topmost bit of the output $Q_D$ of flip-flop 154e, is a high signal, that signal is inverted by inverter 188 and forwarded to shift register 150 as a clock pulse. This causes shift register 150 to shift, i.e., propagating the high signal of flip-flop 150a to flip-flop 150b which in turn produces a low signal that activates row ROW1 of array 132. In addition, the topmost bit of shift register 154 is recycled back to flip-flop 154a, causing shift register 154 to begin again the sequence of scanning the columns of array 132. In addition, all flip-flops of shift registers 150 and 154 may be replaced by other types of flip-flops so long as they perform the described functions.

As for activating indicator counter 144, a flip-flop 170, a second D-type flip-flop 172, and an AND gate 174 are provided. These devices produce the indicator clock signal $\overline{ICLK}$ and the indicator clear signal $\overline{ICLR}$, as best shown in FIG. 7. These signals are designed to be activated at the tail end of the switch array scan sequence. In operation, shift register 150 continues to be incremented even after the last row of switch array 132 has been scanned. After shift register 150 have incremented some 32 times beyond the last scan of switch array 132, a signal is produced at output $\overline{Q_C}$ which is inputted into DFF 172 as a clock pulse. This produces a high signal at the output of DFF 172, which is then inputted into AND gate 174. The low output of AND gate 174 is the resultant $\overline{ICLK}$ signal. Simultaneously, output $\overline{Q_D}$ of flip-flop 170 produces a low signal, the $\overline{OCLR}$ signal. The simultaneous presence of these two signals clears counter 144. After eight additional clock pulses, the $\overline{ICLR}$ signal is disabled.

From the instant that the clear signal was removed from counter 144, counter 144 proceeds to advance or count through the binary sequence. For example, assume that the CAPS LOCK capability is represented by binary numerals "1110", counter 144 is required to increment fourteen times before LED 143a can be activated. Although the $\overline{ICLR}$ signal has disappeared after counter 144 has incremented eight times, the $\overline{ICLK}$ signal is still present to increment counter 144. Upon the presence of a long-duration $\overline{CMD}$ signal after the fourteenth count of counter 144, LED 143a is turned on. In addition, a $\overline{CLR}$ signal is produced by Schmitt trigger 160 that clears DFF 172 which in turn disables the $\overline{ICLK}$ signal. The absence of the $\overline{ICLK}$ signal locks in place the CAPS LOCK indicator, LED 143a. This indication is locked in place until it is cleared toward the tail end of a subsequent scan sequence. In this fashion other indication capabilities such as NUM LOCK or SHIFT LOCK may be selected. For example, NUM LOCK could be binary numeral "1011" and SHIFT LOCK "1101". Moreover, counter 144 is capable of activating multiple indications during a single sequence, e.g., CAPS LOCK and NUM LOCK.

Figure 8:
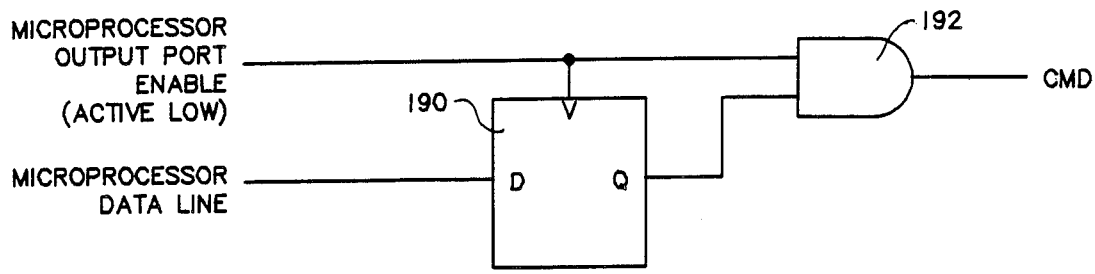
FIG. 8 is a detailed block diagram of the output port of the terminal of FIG. 3.

In FIGS. 3 and 8, a detailed illustration of output port 40 of terminal 36 is shown. Output port 40 comprises a flip-flop 190 and an AND gate 192. Flip-flop 190, a conventional DFF, has its inputs connected to an output port enable signal of microprocessor 38 and an internal data line of microprocessor 38. AND gate 192 has its inputs connected to the output Q of DFF 190 and the output port enable signal of microprocessor 38. The output of AND gate 192 is the CMD signal that is forwarded to keyboard interface means 34.

In operation, whenever a signal is to be outputted by terminal microprocessor 38, the data line is enabled, causing DFF 190 to latch onto that signal. Thus, a signal appears at the output Q of DFF 190. To activate output port 40, permitting the transmission of a signal to keyboard 30, microprocessor 38 produces the output port enable signal. The combined presence of a high signal at the DFF output and a high output port enable signal causes the transmission of the CMD signal to keyboard 30. In contrast, when the data line from microprocessor 38 is low, causing DFF 190 to output a low signal, a low signal is forwarded by AND gate 192. In the preferred embodiment, the short-durationed CMD signal produced by AND gate 192, functioning as the CLK signal when it reaches keyboard interface 34, has a duration that is identical to the duration of the output port enable signal from microprocessor 38. The period that DFF 190 is low is identical to the duration of the long-durationed CMD signal, evolving into the CLR signal in keyboard interface means 34.

It will be apparent to those skilled in the art that various modifications may be made within the spirit of the invention and the scope of the appended claims.

I claim:

1. In a computer system comprising a terminal and a keyboard, said terminal comprising a central control means for controlling the operation of said keyboard and said keyboard comprising a switch array having a plurality of rows and a plurality of columns, the improvement wherein:

said terminal further comprises a data output port for transmitting command signals from said central control means and a data input port for receiving a data signal from said keyboard, said terminal commmand signals comprising a keyboard initialize signal and a keyboard increment signal each having a different duration;

said keyboard further comprises a four-wire keyboard interface means for communicating with said terminal, wherein said interface means receives the keyboard initialize signal, initializes the remainder of the keyboard, receives the keyboard increment signal to cause said switch array to be scanned after the receipt of said keyboard initialize signal, said scanning of said switch array being capable of detecting the activation of a location of said switch array after the receipt of said keyboard increment signal, and transmits said data signal after detecting the activation of said location of said switch array, said four wire keyboard interface means further comprising a row selector means for detecting the row position of said location of said switch array, a column selector means for detecting the column position of said location of said switch array, and a command differentiator means for differentiating said command signal received by said four-wire keyboard interface means, said command differentiator means comprising a signal duration differentiating means being capable of differentiating among said command signals.

2. In a computer system comprising a terminal and a keyboard, said terminal comprising a central control means for controlling the operation of said keyboard and said keyboard comprising a switch array having a plurality of rows and a plurality of columns, the improvement wherein:

said terminal further comprises a data output port for transmitting command signals from said terminal central control means and a data input port for receiving a data signal from said keyboard, said terminal command signals comprising a keyboard initialize signal and a keyboard increment signal; and said keyboard further comprising a four-wire keyboard interface means for communicating with said terminal, wherein said interface means receives the keyboard initialize signal and initializes the remainder of the keyboard, receives the keyboard increment signal to cause said switch array to be scanned after the receipt of said keyboard initialize signal, said scanning of said switch array being capable of detecting the activation of a location of said switch array after the receipt of said keyboard increment signal, and transmits said data signal after detecting the activation of said location of said switch array, wherein said four-wire keyboard interface means comprises a row selector means for detecting the row position of said location of said switch array comprising at least one demultiplexer means for detecting the row position of said switch array location, said demultiplexer means having a plurality of outputs each of which is in communication with one of said rows of said switch array, a counter means for controlling the operation of said demultiplexer means, said counter means being capable of receiving both types of said command signals, and an inverter means for enabling said demultiplexer means, a column selector means for detecting the column position of said location of said switch array comprising at least one multiplexer means for detecting the column position of said switch array location, said multiplexer means having a plurality of inputs each of which is in communication with one of said columns of said switch array, said multiplexer means being adapted to produce said data signal, said counter means being adapted to control the operation of said multiplexer means, and a driver means for amplifying said data signal, and a command differentiator means comprising an inverter means, a resistor means, a capacitor means, and a comparator means for transmitting said keyboard initialize signal for differentiating said command signal received by said four-wire keyboard interface means, said differentiator means being capable of differentiating the two types of said command signals, said keyboard increment signal for incrementing said row selector means and said column selector means to scan said switch array, and said keyboard initialize signal for initializing said scanning sequence.

3. In a computer system comprising a terminal and a keyboard, said terminal comprising a central control means for controlling the operation of said keyboard and said keyboard comprising a switch array having a plurality of rows and a plurality of columns, the improvement wherein:

said terminal further comprises a data output port for transmitting command signals from said terminal central control means and a data input port for receiving a data signal from said keyboard, said terminal command signals comprising a keyboard initialize signal and a keyboard increment signal; and said keyboard further comprises a four-wire keyboard interface means for communicating with said terminal, wherein said interface means receives the keyboard initialize signal and initializes the remainder of the keyboard, receives the keyboard increment signal to cause said switch array to be scanned after the receipt of said keyboard initialize signal, said scanning of said switch array being capable of detecting the activation of a location of said switch array after the receipt of said keyboard increment signal, and transmits said data signal after detecting the activation of said location of said switch array, wherein said four-wire keyboard interface means further comprises a row selector means for detecting the row position of said location of said switch array;

a column selector means for detecting the column position of said location of said switch array comprising a plurality of AND-function devices, said devices being configured to sequentially scan the columns of said switch array, and a master OR-function device for producing said data signal; and a command differentiator means for differentiating said command signal received by said four-wire keyboard interface means, said differentiator means being capable of differentiating the two types of said command signals, said keyboard increment signal for incrementing said row selector means and said column selector means to scan said switch array, and said keyboard initialize signal for initializing said scanning sequence.

4. The improvement as claimed in claim 3, wherein said four-wire keyboard interface means further comprises a counter means for controlling the operation of said row selector means and said column selector means.

5. The improvement as claimed in claim 3, wherein said four-wire keyboard interface means further comprises
   a plurality of current protection means each of which is in communication with one of said AND-function devices of said column selector means, said current protection means comprising a resistor means, an inverter means, and a transistor means; and
   a transmitting means.

6. In a computer system comprising a terminal and a keyboard, said terminal comprising a central control means for controlling the operation of said keyboard and said keyboard comprising a switch array having a plurality of rows and a plurality of columns, the improvement wherein:
   said terminal further comprises a data output port for transmitting command signals from said terminal central control means and a data input port for receiving a data signal from said keyboard, said terminal command signals comprising a keyboard initialize signal and a keyboard increment signal; and
   said keyboard further comprising a four-wire keyboard interface means for communicating with said terminal, wherein said interface means receives the keyboard initialize signal and initializes the remainder of the keyboard, receives the keyboard increment signal to cause said switch array to be scanned after the receipt of said keyboard initialize signal, said scanning of said switch array being capable of detecting the activation of a location of said switch array after the receipt of said keyboard increment signal, and transmits said data signal after detecting the activation of said location of said switch array,
   wherein said four-wire keyboard interface means further comprises
   a row selector means for detecting the row position of said location of said switch array comprising a shift register means for sequentially scanning the rows said switch array, said shift register means comprising a plurality of flip-flop means, one of said flip-flop means having the characteristic of producing one type of output when it receives said keyboard initialize signal, and the remainder of said flip-flop means having the characteristic of producing another type of output when they receive said keyboard initialize signal,
   a column selector means for detecting the column position of said location of said switch array comprising a plurality of AND-function devices for sequentially scanning the columns of said switch array, and a master OR-function device for producing said data signal;
   a counter means for controlling the operation of said row selector means and said column selector means, comprising a plurality of flip-flop means, one of said flip-flop means having the characteristic of producing one type of output when it receives said keyboard initialize signal, and the remaining of said flip-flop means having the characteristic of producing another type of output when they receive said keyboard initialize signal; and
   a plurality of current protection means each of which is in communication with one of said AND-function devices of said column selector means, said current protection means comprising a resistor means, an inverter means, a transistor means, and a transmitting means; and
   a command differentiator means for differentiating said command signal received by said four-wire keyboard interface means, said differentiator means being capable of diffferentiating the two types of said command signals, said keyboard increment signal for incrementing said row selector means and said column selector means to scan said switch array, and said keyboard initialize signal for initializing said scanning sequence, said command differentiator means comprising
   a signal duration differentiating means for differentiating the duration of said command signal, the durations of the two types of said command signal being different, said signal duration differentiating means comprising a resistor means, a capacitor means and a driver means, and
   an initialization means for transmitting said keyboard initialize signal, said initialization means comprising a comparator means.

7. The improvement as claimed in claim 6 wherein said four-wire keyboard interface means further comprises
   an indicator means for indicating status of predetermined characteristics of said keyboard, and
   an indicator control means for controlling said indicator means.

8. The improvement as claimed in claim 7, wherein said indicator control means comprises
   a plurality of flip-flop means and an AND-function device, said flip-flop means and said AND-function device being capable of producing an indicator initialization signal and an indicator operating signal.

9. The improvement as claimed in claim 7, wherein said indicator means comprising
   a counter means for actuating said special features,
   a plurality of indication means each of which verifies the activation of one of said special features, and
   a plurality of resistor means.

10. The improvement as claimed in claim 9, wherein said indicator control means comprises
    a plurality of flip-flop means and AND-function device, said flip-flop means and said AND-function device being capable of producing an indicator initialization signal and an indicator operating signal.

11. The keyboard interfere of claim 1 wherein the first portion of the interface is capable of generating at least two types of command signals and wherein the command signal means differentiates between the two types of command signals and interrogates at least one selected switch in response to a first type of command signal and clears the second portion of the interface in response to a second type of command signal.

12. The keyboard interface of claim 2 wherein first portion of the interface causes the command signal means to interrogate each switch of the array before generating the second type of command signal.

* * * * *